United States Patent [19]

Tanioka

[11] Patent Number: 4,724,490
[45] Date of Patent: Feb. 9, 1988

[54] IMAGE INPUT DEVICE

[76] Inventor: Hiroshi Tanioka, c/o Canon Kabushiki Kaisha, 30-2, 3-chome, Shimomaruko, Ohta-ku, Tokyo, Japan

[21] Appl. No.: 56,362

[22] Filed: May 28, 1987

Related U.S. Application Data

[63] Continuation of Ser. No. 898,799, Aug. 20, 1986, abandoned, which is a continuation of Ser. No. 544,239, Oct. 21, 1983, abandoned.

[30] Foreign Application Priority Data

Nov. 1, 1982 [JP] Japan ................. 57-192187
Nov. 1, 1982 [JP] Japan ................. 57-192188

[51] Int. Cl.⁴ ................. H04N 1/10; H04N 1/04; H04N 1/23
[52] U.S. Cl. ................. 358/294; 358/285; 358/293; 358/296; 346/160
[58] Field of Search ............. 358/256, 285, 286, 293, 358/294, 296, 300; 346/76 PH, 160; 250/578

[56] References Cited

U.S. PATENT DOCUMENTS

| | | | |
|---|---|---|---|
| 4,257,071 | 3/1981 | Lamb | 358/294 |
| 4,314,282 | 2/1982 | Fischbeck et al. | 358/286 |
| 4,317,137 | 2/1982 | Tompkins | 358/293 |
| 4,424,523 | 1/1984 | Snelling et al. | 346/160 |

OTHER PUBLICATIONS

L. L. Wu; Document Reader and Printer; Apr. 1974; IBM Technical Disclosure Bulletin; vol. 16, No. 11; pp. 3568-3569.

Primary Examiner—Howard W. Britton
Assistant Examiner—John K. Peng
Attorney, Agent, or Firm—Fitzpatrick, Cella, Harper and Scinto

[57] ABSTRACT

An image input device having an original exposing portion and an image sensor portion disposed and an image sensor portion disposed on a common insulating substrate. The original exposing portion is formed by one or more light-emitting elements. The image sensor portion is formed by one or more light-receiving elements individually corresponding to the light-emitting elements and receiving the lights of the light-emitting elements after the exposure of an original and putting out electrical signal levels in accordance with the quantities of received light. This invention further provides an image output and input device which includes in addition to said original exposing portion and said image sensor portion, a thermal head portion formed by one or more heat-generating resistance members which receives the electrical signals from the light-receiving element and generates heat.

2 Claims, 7 Drawing Figures

IMAGE INPUT DEVICE

This application is a continuation of application Ser. No. 898,799, filed Aug. 20, 1986, which was a continuation of application Ser. No. 544,239, filed Oct. 21, 1983, all now abandoned.

BACKGROUND OF THE INVENTION

1. Field of the Invention

This invention relates to an image input device.

2. Description of the Prior Art

To process an original image as image information, there is required an original exposing portion for making the original image into an optical image and an image sensor portion for reading the original image made into an optical image and converting it into an electrical signal capable of being processed.

The light source of the original exposing portion may be a fluorescent lamp, a halogen lamp or a light-emitting diode (LED). The device for the image sensor may be a CCD type image sensor, an MOS type image sensor or a thin film photodiode. Heretofore, these devices have been manufactured individually and accordingly, to form an image input device or an image input and output device, it has been necessary to inspect the performances of these devices individually and select and combine devices meeting the applicable standards and requirements. Also, the respective devices have been provided independently of one another and this has led to the problem that the apparatus becomes bulky.

SUMMARY OF THE INVENTION

The present invention has been made in view of the above-noted points and an object thereof is to provide an image input device and an image input and output device which overcome the disadvantages peculiar to the image input device and image input and output device according to the prior art.

Another object of the present invention is to provide an image input device and an image input and output device which are compact and well balanced in performance by an original exposing portion and an image sensor portion being integrally provided on a common insulating substrate.

The invention will become fully apparent from the following detailed description thereof taken in conjunction with the accompanying drawings.

DESCRIPTION OF THE PREFERRED EMBODIMENTS

Several embodiments of the present invention will hereinafter be described by reference to the drawings.

Figure 1:
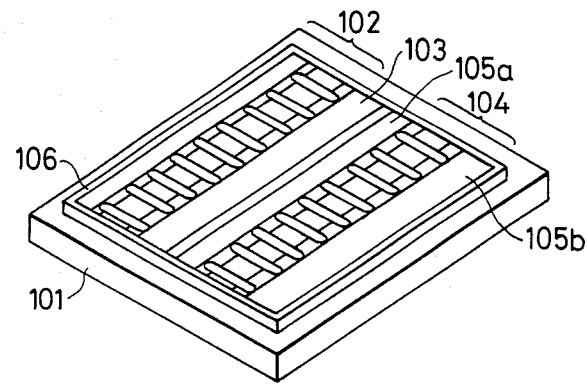
FIG. 1 is a perspective view of an image input device according to a first embodiment of the present invention.
Figure 2:
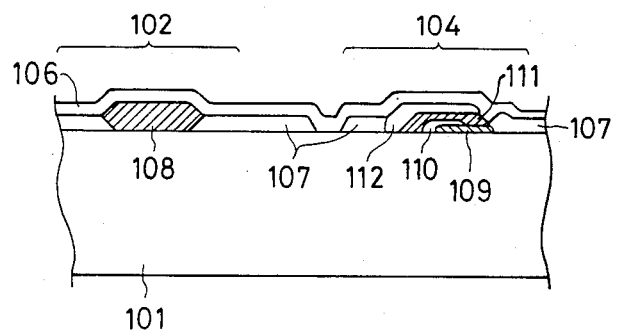
FIG. 2 is a cross-sectional view showing the construction of the image input device shown in FIG. 1.

Referring to FIG. 1 which is a perspective view of the image input device according to an embodiment of the present invention, reference numeral 101 designates a glazed ceramic substrate, reference numeral 102 denotes an original exposing portion, and reference numeral 103 designates the electrical wiring portion of the original exposing portion 102. Reference numeral 104 denotes an image sensor portion, and reference characters 105a and 105b designate the wiring portions of the image sensor portion 104. FIG. 2 is a cross-sectional view showing in more detail the construction of the embodiment shown in FIG. 1. The original exposing portion 102 is constituted by light-emitting diodes 108 formed of Gap or like material and a wiring portion 107 of a electrically conductive film formed of Au or like material for driving the light-emitting diode 108. The image sensor portion 104 comprises a photodiode and a blocking diode. The photodiode is comprised of a transparent electrically conductive film 112 such as $SnO_2$ or $In_2O_3$, a CdS film 111, a CdTe film 110 and a Te film 109, and the blocking diode is comprised of a Te film 109, a Cds film 111 and an electrically conductive metal film 107. The rectifying property of the photodiode is exhibited by hetero sealing of Cds (n type layer)-CdTe (p type layer) and the photosensitivity of the photodiode is exhibited by light being applied from the light-receiving window of the transparent electrically conductive film 112 to the hetero sealing portion. The rectifying property of the blocking diode is exhibited by shot key sealing of CdS- Te. The group of light emitting diodes and the group of diodes are arranged in a row and parallel to each other on the ceramic substrate 101, and these are covered with a wear resisting film 106 which may be a two-layer $SiO_2$-$Ta_2O_5$ film or SiC film.

Figure 3:
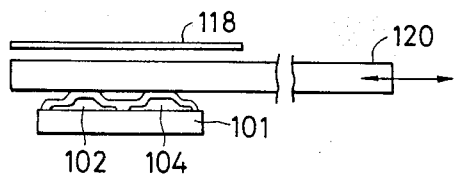
FIG. 3 shows an example of the use of the image input device shown in FIG. 1.
Figure 4:
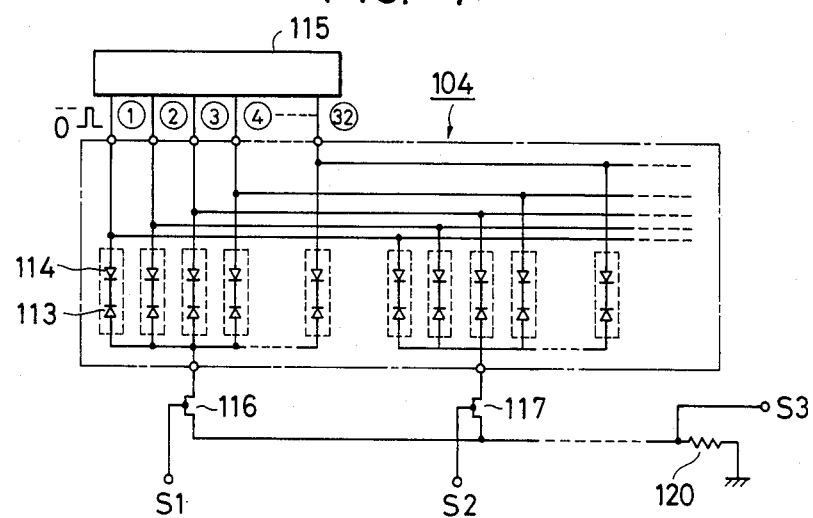
FIG. 4 is a circuit diagram for explaining the operation of the image sensor portion in the first embodiment of the present invention.

Referring to FIG. 3, which shows an example of the use of the first embodiment, reference numeral 118 designates an original and reference numeral 120 denotes an original supporting table. FIG. 4 is a circuit diagram for explaining the operation of the image sensor portion 104 in the embodiment of the present invention. In FIG. 4, reference numeral 113 designates photodiodes and reference numeral 114 denotes blocking diodes. Reference numeral 115 designates a shift register, reference numerals 116 and 117 denote MOS transistor switches, and reference numeral 120 designates a resistor.

The operation of the first embodiment will now be described by reference to FIGS. 3 and 4.

When the original supporting table 120 with the original 118 thereon is moved to a predetermined position by a driving device, not shown, the operation of the shift register 115 is started by a control circuit, not shown, and signal pulses are put out from the output terminals ①- ㉜ . At this time, the switch 116 is selected by the output signal Ⓐ of the control circuit and conducts and therefore, pulse signals are accumulated in the group of diodes connected to the switch 116. When the accumulation is terminated, light is applied from the light-emitting diodes 108 of the original exposing portion 102 toward the original 118. The photodiodes 113 corresponding to the individual light-emitting diodes 108 receive the reflected light from the original, and discharge the stored charge through the switch 116 in accordance with the quantity of received light. Thereafter, signal pulses are again put out from the output terminal ①- ㉜ of the shift register 115 and applied to the group of diodes, and a charge corresponding to the amount of discharge is again accumulated, but at this time, a re-coupling current flows in through the resistor 120 and the switch 116. This is taken out as a video signal ⑪ from one end of the resistor 120. The group of diodes connected to the switch 117 also operates likewise, but the switch 117 is suitably controlled by the output signal of the control circuit so that the group of diodes connected to the switch 117 accumulates signal pulses therein during the time that the group of diodes connected to the switch 116 discharges by the light-emitting diodes 108. When the scanning of the group of diodes arranged in a row is terminated in this manner, the original supporting table 120 and accordingly, the original 118 are moved to the predetermined position, whereupon the next scanning is started.

Figure 5:
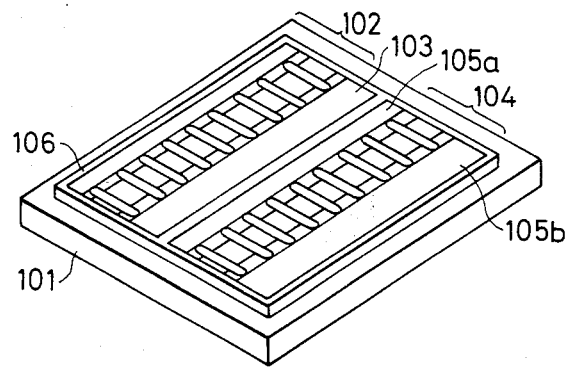
FIG. 5 is a perspective view of an image input and output device according to a second embodiment of the present invention.
Figure 6:
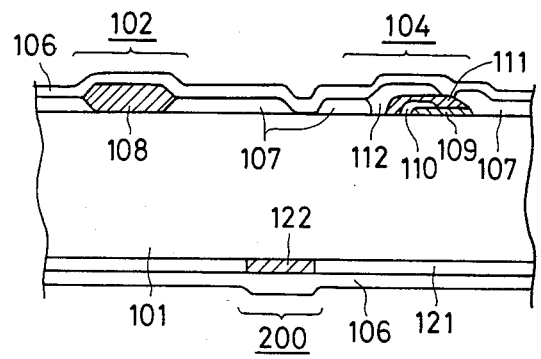
FIG. 6 is a cross-sectional view showing the construction of the image input and output device shown in FIG. 5.

In the foregoing description, scanning has been effected by moving the original supporting table, but it is of course possible to adopt a construction in which the image input device according to the embodiment of the present invention is moved FIG. 5 is a perspective view of the image input and output device according to a second embodiment of the present invention, and FIG. 6 is a cross-sectional view showing the construction thereof in more detail.

In these FIGURES, members similar to those in FIGS. 1 and 2 are given similar reference numerals. The difference of the second embodiment from the first embodiment is that a printing portion 200 is provided on the back of the image input portion. The printing portion 200 is constituted, for example, by a thermal head portion which comprises heat-generating resistance members 122 and a wiring portion 121 for driving the same.

Figure 7:
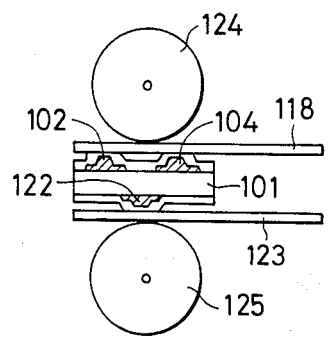
FIG. 7 shows an example of the use of the image input and output device shown in FIG. 5.

FIG. 7 shows an example of the use of the second embodiment. In FIG. 7, reference numeral 123 designates a transfer medium, and reference numerals 124 and 125 denote rotatable rollers. The other reference numerals are similar in significance to those appearing in FIG. 3.

The operation of the second embodiment will now be described by reference of FIGS. 4 and 7.

The original 118 and transfer medium 123 are fed between the rotatable rollers and the image input and output device of the present invention by the driving device, not shown, of the rotatable rollers 124, 125 and the operation of the shift register 115 is started by a control circuit, not shown, and signal pulses are put out from the output terminal ①- ㉜ thereof. At this time, the switch 116 is selected by the output signal S1 of the control circuit and conducts and therefore, pulse signals are accumulated in the group of diodes connected to the switch 116. When the accumulation is terminated, light is applied from the light-emitting diodes 108 of the original exposing portion 102 toward the original 118. The photodiodes 113 corresponding to the individual light-emitting diodes 108 receive the reflected light from the original and discharge the stored charge through the switch 116 in accordance with the quantity of received light. Thereafter, signal pulses are again put out from the output terminals ①- ㉜ of the shift register 115 and applied to the group of diodes and a charge corresponding to the amount of discharge is again accumulated, but at this time, a re-coupling current flows in through the resistor 120 and the switch 116. This is taken out as a video signal S3 from one end of the resistor 120. This video signal S3 is converted into a driving current for the thermal head portion 200 by the control circuit and supplied to each corresponding heat-generating resistance member 122. The heat-generating resistance members 122 generate heat in conformity with the magnitude of the driving current and a transferred image is recorded on the transfer medium 123. The group of diodes connected to the switch 117 also operates likewise, and the switch 117 is suitably controlled by the output signal of the control circuit so that the group of diodes connected to the switch 117 accumulates signal pulses therein during time that the group of diodes connected to the switch 116 discharges by the light-emitting diodes 108. When the scanning of the group of diodes arranged in a row is terminated in this manner, the rotatable rollers 124 and 125 are rotated by a predetermined angle and the original 118 and transfer medium are moved forward and thus, scanning is again effected.

According to the present invention, as described above, an original exposing portion, an image sensor portion and further a printed portion are disposed on the same substrate, whereby compactness of the device can be achieved. Also, the original exposing portion, the electrodes of the image sensor and the printed portion, the wiring portion and the wear resisting film are formed through the same manufacturing process, and this leads to the possibility of reducing the irregularity of the characteristic and decreasing the number of process steps. Further, the fact that the original exposing portion, the image sensor portion and the printed portion are finished through the same manufacturing process leads to reduced irregularity of the characteristic of the image input and output device. In addition, the performance of each portion can be adjusted during the manufacturing process, and this leads to the possibility of saving the labor of inspecting the performance of the individual portions, selecting them combining them and making a device as has heretofore been done.

What I claim is:

1. An image input and output device comprising:
    an original exposing portion comprising one or more light-emitting elements,
    an image sensor portion comprising one or more light-receiving elements individually corresponding to said light-emitting elements and receiving the light of said light-emitting elements after the exposure of an original and putting out electrical signal levels in accordance with the quantities of received light, thereby to read the original, and
    a thermal head portion comprising one or more heat-generating resistance members individually corresponding to said light-receiving elements and receiving the electrical signals from said light-receiving elements and generating heat corresponding to the electrical signal levels, and effecting printing using a thermosensitive transfer medium simultaneously with and independently of reading of the original by said image sensor portions,
    said original exposing portion and said image sensor portion being disposed on one side surface of a common insulating substrate, and
    said thermal head portion being disposed on the other surface of said common insulating substrate.

2. An image input and output device according to claim 1, wherein said original exposing portion, said image sensor portion and said thermal head portion are finished through the same manufacturing process.

* * * * *

UNITED STATES PATENT AND TRADEMARK OFFICE
CERTIFICATE OF CORRECTION

PATENT NO. : 4,724,490            Page 1 of 2
DATED : February 9, 1988
INVENTOR(S) : HIROSHI TANIOKA It is certified that error appears in the above-identified patent and that said Letters Patent is hereby corrected as shown below:

AT [76] IN INVENTOR

"Hiroshi Tanioka, c/o Canon Kabushiki Kaisha, 30-2, 2-chome, Shimomaruko, Ohta-ku, Tokyo, Japan" should read --Hiroshi Tanioka, Tokyo, Japan.--

AT [73] IN ASSIGNEE

--Canon Kabushiki Kaisha, Tokyo, Japan-- should be inserted.

AT [57] IN THE ABSTRACT

Line 2, "and an" (second occurrence) should be deleted.
Line 3, "image sensor portion disposed" should be deleted.
Line 8, "lights" should read --light--.

COLUMN 2

Line 20, "a" should read --an--.
Line 27, "Cds" should read --CdS--.
Line 28, "107." should read --112.--.
Line 29, "hetero sealing" should read --heterosealing--.
Line 29, "Cds" should read --CdS--.
Line 33, "hetero sealing" should read --heterosealing--.
Line 34, "shot" should read --schottkey--.
Line 35, "key" should be deleted.
Line 35, "CdS- Te." should read --CdS-Te.--.
Line 59, "terminals ①-③②." should read --terminals ①-③② thereof.--.

UNITED STATES PATENT AND TRADEMARK OFFICE
CERTIFICATE OF CORRECTION

PATENT NO. : 4,724,490
DATED : February 9, 1988
INVENTOR(S) : HIROSHI TANIOKA

It is certified that error appears in the above-identified patent and that said Letters Patent is hereby corrected as shown below:

COLUMN 3

Line 3, "terminal ①-㉜" should read
--terminals ①-㉜--.
Line 17, "and" should read --and,--.
Line 44, "of" should read --to--.
Line 51, "terminal ①-㉜" should read
--terminals ①-㉜--.

COLUMN 4

Line 12, "time" should read --the time--.
Line 37, "them" (first occurrence) should read --them,--.

Signed and Sealed this

Seventh Day of February, 1989

*Attest:*

DONALD J. QUIGG

*Attesting Officer*   *Commissioner of Patents and Trademarks*